US005751059A

United States Patent [19]
Prost

[11] Patent Number: 5,751,059
[45] Date of Patent: May 12, 1998

[54] PYROELECTRIC SENSOR

[75] Inventor: Roger Prost, St. Egreve, France

[73] Assignee: Thomson-CSF Semiconducteurs Specifiques, Paris, France

[21] Appl. No.: 631,816

[22] Filed: Apr. 12, 1996

Related U.S. Application Data

[63] Continuation of Ser. No. 185,968, filed as PCT/FR93/00586 Jun. 16, 1993, abandoned.

[30] Foreign Application Priority Data

Jun. 19, 1992 [FR] France ................ 92 07482

[51] Int. Cl.$^6$ .............. H01L 23/053; H01L 23/06; H01L 23/34
[52] U.S. Cl. .............. 257/701; 257/703; 257/712; 257/717
[58] Field of Search .............. 257/701, 702, 257/709, 676, 674, 675, 669, 712, 713, 717, 718, 719, 782, 783, 420, 703

[56] References Cited

U.S. PATENT DOCUMENTS

| | | |
|---|---|---|
| 4,383,174 | 5/1983 | Matsumurra et al. ........ 250/338 |
| 5,091,770 | 2/1992 | Yamaguchi ................ 257/701 |
| 5,145,931 | 9/1992 | Nakayoshi et al. .......... 528/15 |

FOREIGN PATENT DOCUMENTS

| | | |
|---|---|---|
| 0368262 | 11/1989 | European Pat. Off. . |
| 3029366 | 2/1991 | Japan . |

*Primary Examiner*—Carl W. Whitehead
*Assistant Examiner*—Jhihan B. Clark
*Attorney, Agent, or Firm*—Oblon, Spivak, McClelland, Maier & Neustadt, P.C.

[57] ABSTRACT

The invention relates to components such as pyroelectric sensors which are particularly sensitive to piezoelectric effects and which, consequently, are disturbed by the mechanical deformations or the vibrations which the component may experience. In order to limit these disturbances, it is proposed to insert, between the chip (10) carrying the pyroelectric layer and the bottom of the package (30), a flexible sheet (42) of silicone which absorbs the deformations of the package without transmitting them to the chip. Ultrasonic bonding of the connecting wires (34) is still possible despite the presence of the flexible sheet. The chip is preferably fixed to a metallized ceramic plate (40) and abutments (44) are preferably provided at the bottom of the package in order to limit the compression of the flexible sheet (42) during the bonding operation.

5 Claims, 1 Drawing Sheet

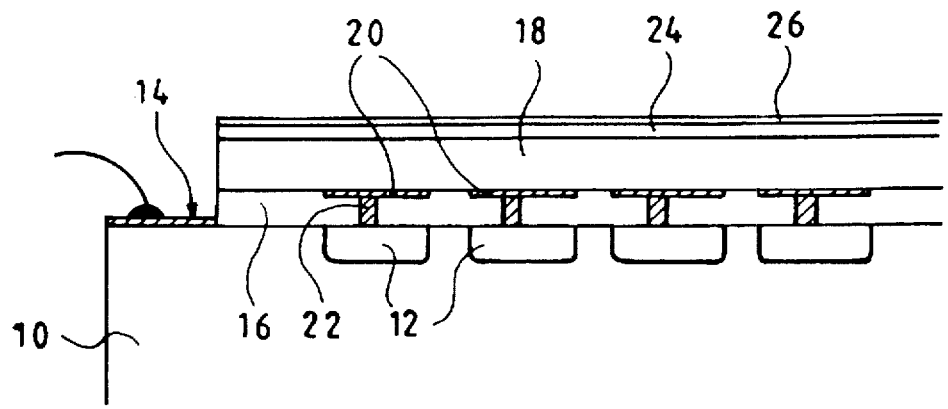
FIG.1
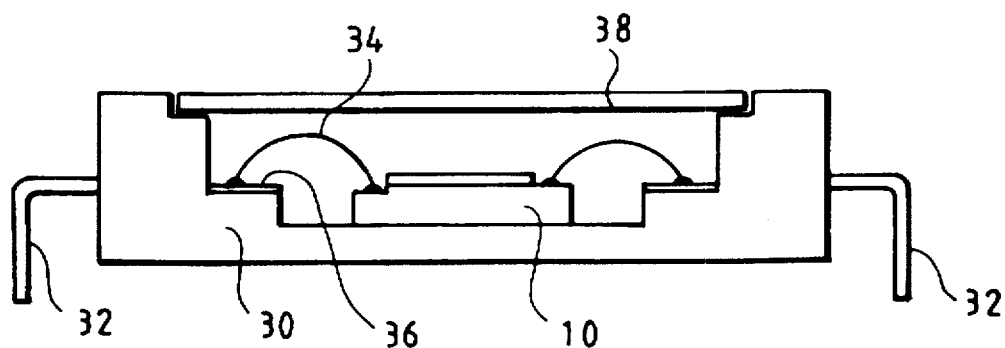
FIG.2
PRIOR ART
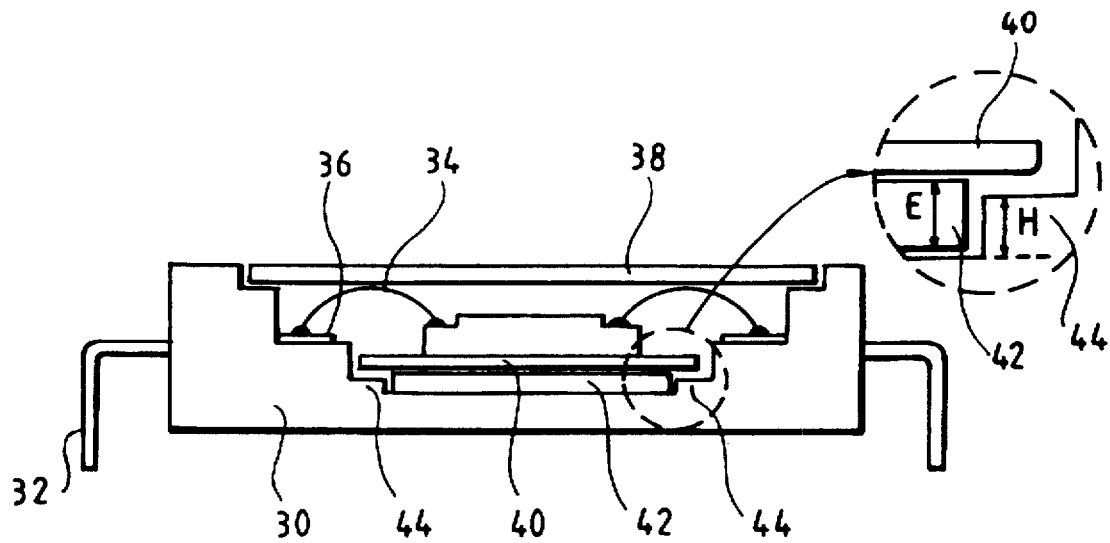
FIG.3b
FIG.3a

PYROELECTRIC SENSOR

This application is a continuation of application Ser. No. 08/185,968, filed on Feb. 9, 1994, filed as PCT/FR93/00586 on Jun. 16, 1994, now abandoned.

BACKGROUND OF THE INVENTION

1. Field of the Invention

The invention relates principally to pyroelectric sensors, that is to say to devices capable of supplying an electrical signal representing the thermal radiation (principally infrared radiation) from a body placed in front of the sensor. The invention relates especially to matrix sensors supplying electrical signals representing a thermal image of a radiating body placed in front of the sensor or of a radiating landscape observed by the sensor.

2. Description of the Related Art

In order to produce such sensors, there is a tendency to now use pyroelectric materials deposited as a thin layer onto a silicon substrate. The pyroelectric material, which is itself coated with a layer absorbing infrared rays, heats up and generates quantities of electric charges dependent on this heat-up; the charges are reproduced, by capacitive coupling, in the silicon; electrical signals are thus produced in the silicon and are processed by circuits produced according to the technology of semiconductor integrated circuits, more specifically, charge-transfer circuits.

The pyroelectric materials which are used are preferably those which can be deposited as very thin layers onto silicon substrates and these materials unfortunately have the drawback of being highly piezoelectric, that is to say they generate electric charges when they undergo mechanical deformation. These charges are added to or subtracted from the charges generated by the pyroelectric effect which it is sought to detect; they strongly disturb the useful signal emitted by the sensor. The mechanical deformations arise from the environment and are transmitted to the pyroelectric layer via the silicon substrate and the various elements constituting the package of the component.

In order to limit the deleterious effects of the deformations or vibrations transmitted to the pyroelectric layer, it has already been proposed to "mosaic" the pyroelectric layer, that is to say to divide it into elementary detection zones separated from each other. The detection zones then have very small dimensions and are much less sensitive to the deformations transmitted by the package. However, this solution does not appear to be sufficient and it is difficult to implement.

It may also be envisaged to mount the component on a very rigid support, such as a ceramic slab of more than one centimeter in thickness. The silicon chip covered with pyroelectric material is mounted in a package having rigid metal output leads, and the package is fixed to the rigid thick support. The component is then connected to the outside (connection to a printed circuit) via ribbons of flexible wires. The rigidity of the thick support of the component and the connection via flexible wires enable the pyroelectric layer to be well protected from the deformations of the package; but it has major practical drawbacks: on the one hand, the entire component, encapsulated in a package, will have a height significantly greater than the standard height, which will prohibit its use in many applications. Moreover, a connection via ribbons of wires is a non-standardized connection which significantly complicates the mounting of the electronic boards using the component.

It could also be envisaged to place beneath the package, instead of the thick and rigid ceramic slab, a thin plate of flexible material which prevents the transmission of deformations; but the problem of connecting the component, which will still have to be performed using a ribbon of flexible wires, remains; a conventional connection via leads soldered to a printed-circuit board would, in fact, risk transmitting the mechanical deformations of the board to the layer of pyroelectric material; and, in addition, the fixing of the component to a printed circuit via a flexible sheet would pose difficult problems.

Apart from these solutions, which have been specially designed to solve the difficult problem of pyroelectric components (large signal errors even for low stresses exerted on the package), assemblies intended to mechanically protect a fragile component inside a package may, of course, also be found in the prior art.

For example, in the prior art relating to semiconductor components, structures have already been proposed for protecting from stresses in the case of the integration of entire silicon wafers of several tens of square centimeters in surface area ("Wafer-Scale Integration"). These wafers are very fragile and risk being broken when their rear surface and the surface of the base on which they rest have imperfections in planarity: a liquid is then interposed between the wafer and the bottom in order to compensate for these imperfections, and an elastic block, pressed against the top of the package, keeps the chip against the liquid. However, the presence of liquid does not prevent the transmission of stresses and of vibrations to the wafer. The patent U.S. Pat. No. 4,715,115 describes such a structure.

Other solutions consist, for example, in embedding the semiconductor chip in a resin. However, it seems that, in all cases, the chip rests directly on the bottom of the package, or in any case, it is not isolated from the package from the point of view of the transmission of stresses and vibrations.

SUMMARY OF THE INVENTION

In order to best solve the problems generated by the natural piezoelectricity of the layer of pyroelectric material of the sensor, it is proposed according to the present invention to insert, between the chip carrying the layer and the package carrying the external connections of the component, a layer of an elastically deformable material capable of absorbing, without transmitting, the major force of the deformations, stresses and vibrations of the package, the chip being connected to the package via bonded flexible connecting wires; moreover, the chip is neither cemented nor bonded directly to the package, nor is it connected to the latter via an element which would itself be coupled to the package in a manner such that the vibrations and stresses experienced by the package would be transmitted to the chip. Means are provided for enabling the connecting wires to be bonded without being impeded by the presence of the deformable layer.

The deformable layer may be a thin flexible sheet. The overall height of the component will be virtually unaffected by the presence of this thin sheet. Moreover, the package may be of standard type (especially a multilayer ceramic package) and its output connections are rigid standard connections, to be soldered to a printed-circuit board.

Preferably, the means for enabling the connecting wires of the chip inside the package to be bonded include a thin ceramic plate to which the chip is cemented or bonded via its rear face, this plate resting on the deformable layer, the plate extending laterally in relation to the chip in order for a tool to be able to bear on the plate during the bonding operation. Preferably, abutments are provided on the bottom of the package in order to limit the compression of the deformable layer or of the flexible sheet during the bonding operation, the plate coming to bear on these abutments above a certain pressure exerted by the tool during the bonding.

Independently of its usefulness in facilitating the bonding of the connecting wires, this rigid plate, to which the chip is cemented, has the advantage of constituting a more rigid assembly, and therefore one which is even better decoupled with respect to the stresses experienced by the package. The tension exerted by the rigid plate on the chip sets up fixed and well-controlled stresses on the chip, which is favourable for the stability of the pyroelectric signal in the case of a pyroelectric component.

It may also be envisaged that the means for bonding the connecting wires of the chip simply consist in the nature of the deformable flexible material: a material is chosen which becomes rigid below a certain temperature and the component is cooled down to this temperature during the bonding operation so that the flexibility of the material is not an impediment during this operation.

In general, silicone-based materials are very suitable. The flexible sheet may be perforated in places if it is desired to increase its flexibility. The distribution and size of the holes make it possible to adjust the capacity of the sheet to be deformed, for one type of material and a given thickness.

Another aspect, with which the invention should be regarded, is that of the method of fabricating a pyroelectric sensor: this method is characterized in that a sheet of flexible material is inserted between a chip covered with a pyroelectric layer and a package; and then connecting wires are bonded between the chip and the package. In the prior art, it was always considered necessary to place the chip on a rigid support before carrying out the bonding of the wires.

The invention is principally intended to produce pyroelectric sensors, because of the very specific problem posed by the high piezoelectric sensitivity of the pyroelectric layer, but it will be understood that it may also be applied, by extension, to other components posing problems of the same kind, that is to say in which the deformations of the chip may disturb the operation of the device in such a way as to be a great nuisance.

BRIEF DESCRIPTION OF THE DRAWINGS

Other characteristics and advantages of the invention will appear on reading the detailed description which follows and which is given with reference to the appended drawings in which:

FIG. 1 represents, by way of example, the construction of a chip forming the core of a monolithic pyroelectric sensor;

FIG. 2 represents a conventional mounting of a chip in a ceramic package; and

FIG. 3 represents a mounting of a monolithic pyroelectric sensor in a ceramic package according to a preferred embodiment of the invention.

DETAILED DESCRIPTION OF THE PREFERRED EMBODIMENTS

FIG. 1 represents diagrammatically the construction of a semiconductor chip constituting a monolithic pyroelectric sensor. Details on the internal construction of such a monolithic sensor may be found in Patent Application FR 90 15 476.

The chip essentially includes a silicon substrate 10 in which the circuits for reading and transferring the electric charges generated by the pyroelectric effect in each elementary image zone of the sensor, are formed using the technologies commonly employed for charge-transfer integrated circuits. These read circuits 12, represented symbolically, include diodes, electrodes insulated from the substrate charge-transfer registers, connections, etc., and, finally, contact pads for the transmission of signals from the chip to the outside or for the transmission of power-supply voltages to the chip from outside.

The contact pads are designated by the reference 14.

The chip is covered, outside the contact pads 14, with an insulating layer 16, generally polyimide of some ten microns in thickness. This layer is itself covered with a pyroelectric layer 18, and bottom electrodes 20 are interposed locally (one bottom electrode per pixel) between the insulating layer 16 and the pyroelectric layer 18. Conducting vias 22 are provided every so often, through the layer 16, in order to connect each bottom electrode to a corresponding read circuit 12.

The pyroelectric layer may be mosaiced, that is to say divided into elementary squares corresponding to each pixel, or may be uniform.

A top electrode 24, for example made of aluminium, enables the potential of the top surface of the pyroelectric layer to be defined.

Finally, a layer 26, which absorbs the infrared rays, is deposited onto the surface of the pyroelectric layer (if this layer is conducting, it may serve as the top electrode). This layer 26 is, for example, made of black aluminium, black chromium or black titanium.

The pyroelectric layer is made of a material having a low thermal conductivity (less than 1 W/m.K or even 0.2 W/m.K), for example PVDF or a pyroelectric composite material comprising a mineral filler in a polyimide. The thickness of the layer may be approximately 10 microns.

This description is given by way of indication in order for the possible construction of the chip constituting the core of a monolithic sensor to be understood.

In the prior art, this chip would be mounted in a package in the manner shown in FIG. 2.

The package is, for example, a multilayer ceramic package 30 having a cavity on the bottom of which the chip is cemented or bonded. The chip is connected to the external pins 32 of the component via flexible connecting wires 34 bonded between the contact pads 14 of the chip and conducting areas 36 forming part of a set of screen-printed and co-fired conductors in the ceramic package, these conductors being connected to the external pins 32. The cavity is closed by a lid 38 transparent to infrared rays and preferably opaque to light rays, for example a germanium lid filtering the wavelengths below 2 microns.

As was mentioned above, this structure of the prior art is very sensitive to the mechanical stresses experienced by the component. These stresses manifest themselves by a disturbance of the signals representing the thermal image detected by the sensor.

The mounting of the sensor according to a preferred embodiment of the invention is shown in section in FIG. 3.

A package is used which may be of the same kind as that of FIG. 2, that is to say, for example, made of multilayer ceramic. It preferably has standardized dimensions, especially in terms of the height, so as to be able to be mounted on a printed-circuit board in a completely standard manner.

The chip is preferably cemented or bonded by conventional means (conductive cement, eutectic solder, "silverglass" type silver solder, etc.) to a thin rigid support plate 40, which may be made of a metallized ceramic or even a conductive metal (molybdenum or Invar-based alloy coated with copper).

This plate 40 rests on a thin sheet 42 of an elastically deformable material, for example a flexible sheet of silicone of a few hundred microns in thickness.

Moreover, the chip is not in rigid contact with any point of the package, nor with any point likely to transmit, directly or indirectly, the stresses or vibrations experienced by the package.

The rigid plate 40/deformable sheet 42 assembly constitutes a particularly effective suspension system: the plate improves the rigidity of the chip and therefore limits the mechanical deformations of the pyroelectric layer, and the elastically deformable sheet limits the transmission to the chip, and therefore to the pyroelectric layer, of the stresses experienced by the package. Moreover, the electrical connection via flexible wires prevents the transmission of stresses via the wires.

Because the chip is rigidly fixed to the plate 40, it experiences a controlled stress (dependent on the nature of the materials of the plate and of the chip). This controlled stress establishes a stable and controlled reference for the black level of the pyroelectric signal. Furthermore, the greater the rigidity of the chip/plate assembly, the better is the mechanical decoupling between the package (isolated from this assembly by the deformable layer 42) and the chip.

The flexible sheet 42 may be pierced with holes or slots distributed over its surface in order to increase its flexibility: the ratio of the surface area of holes to the total surface area may range up to 50%, if desired.

It has been found experimentally that the presence of such a sheet was able to reduce the piezoelectric component of the electrical signal supplied by the sensor by a factor of 30.

However, the mounting shown in FIG. 3 must allow the bonding of the connecting wires 34 between the pads 14 of the chip and the screen-printed and co-fired conducting areas 36 in the package. Now, this bonding is carried out ultrasonically in practice, which would a priori be incompatible with the presence of a flexible support beneath the chip.

This is why, according to the invention, means have been provided which allow bonding, even ultrasonic bonding of aluminium wires, despite the presence of the deformable layer 42.

The simplest way of solving the problem consists in providing that the bottom of the package carries abutments 44, for example an abutment at each corner, against which abutments the internal surface of the plate 40 can bear when the pressure necessary for the operation of bonding the wires to the contact pads 14 of the chip is exerted on the upper surface of the plate. The application of a pressure on the plate compresses and deforms the flexible sheet 42 enough to enable the plate and the abutments to come into contact. By way of illustrative example, the thickness E of the uncompressed flexible sheet is a few hundred microns (for example, 500 microns) and the abutment rises (from the bottom of the package) to a height H approximately 100 microns less than the thickness E.

The clearance E-H thus made between the thickness of the sheet and the height of the abutments is then sufficient to absorb the stresses during use, without the plate coming into contact with the abutments, but not too great that this clearance disappears when the pressure for holding the plate during ultrasonic bonding is applied to the upper surface of the plate. The value of this clearance depends on the flexibility of the material and on the pressure exerted during bonding; it is typically a few tens of microns, up to 100 or 200 microns.

The plate includes, in principle, parts projecting in relation to the chip (for example, a projecting zone over its entire periphery) so that a holding tool can bear on this projecting part without bearing on the chip, while an ultrasonic bonding head bonds the aluminium wires to the contact pads 14 of the chip.

Another way of operating, which does not use abutments, may consist in cooling the component (chip, package and flexible sheet) down to a temperature at which the rigidity of the flexible sheet becomes sufficiently high to support, without deformation, or nearly so, the pressure exerted by the holding tools during bonding of the connecting wires. Care will have to be taken to operate in a sufficiently dry environment to prevent any condensation of water vapour which is incompatible with ultrasonic bonding of aluminium.

The chip may therefore be mounted by firstly fixing the chip to a plate, placing a flexible sheet at the bottom of the package and bonding the connecting wires between the chip on the one hand and conducting areas forming part of the package on the other hand.

In exceptional cases, neither abutments at the bottom of the cavity nor cooling during bonding will be used, but a material will be chosen whose flexibility permits both good mechanical decoupling during use and resistance to the pressure exerted during bonding.

Finally, it may also be envisaged to block the chip during bonding by means of a specific tool (inserts) withdrawn after the bonding operation.

If the power consumption of the sensor is high (matrix sensors with many pixels), it will be possible to fill the flexible sheet with a material which is a good thermal conductor (copper, aluminium nitride powder, etc.).

The component mounting thus described is particularly suited to the production of low-cost components, for example thermal imagers with pyroelectric sensors for motor-vehicle applications.

I claim:

1. An electronic device comprising: a package having a cavity therein, said cavity having a bottom;
    a monolithic integrated circuit chip in said cavity, said chip having contact pads;
    an elastically deformable layer between said chip and the bottom of said cavity;
    conducting areas formed in said package for connection of the chip to external connections;
    wires which electrically connect said monolithic integrated circuit chip to said conducting areas, each of said wires bonded to a respective conducting area of the package and to a corresponding contact pad of the chip;
    wherein said elastically deformable layer absorbs vibrations imparted to said package, and wherein said chip is not mechanically connected to the package through any rigid part likely to transmit said vibrations to said monolithic integrated chip, wherein said chip is fixed to a rigid plate, and said elastically deformable layer is located between said rigid plate and the bottom of the cavity.

2. An electronic device according to claim 1, wherein said rigid plate is a metallized ceramic plate or a plate of metal or a plate of conductive metallic alloy.

3. An electronic device according to any one of claims 1 and 2, wherein said cavity comprises abutments against which said rigid plate bears when a pressure is exerted on said rigid plate from above towards the bottom of the cavity, a height of said abutments above the bottom of the cavity being slightly less than a thickness of said elastically deformable layer when no pressure is exerted thereon from above.

4. An electronic device according to claim 3, wherein the difference between said thickness and said height is set small enough for the rigid plate to come into contact with the abutments under pressure of a bonding tool during a bonding operation in which the wires are bonded to said contact pads of the chip.

5. An electronic device according to any one of claims 1–4, wherein said monolithic circuit chip comprises a pyroelectric layer and acts as a pyroelectric image sensor.

* * * * *